US007829886B2

United States Patent
Maslov et al.

(10) Patent No.: US 7,829,886 B2
(45) Date of Patent: Nov. 9, 2010

(54) NONVOLATILE CARBON NANOTUBE MEMORY DEVICE USING MULTIWALL CARBON NANOTUBES AND METHODS OF OPERATING AND FABRICATING THE SAME

(75) Inventors: Leonid Maslov, Yongin-si (KR); Jin-Gyoo Yoo, Seongnam-si (KR); Cheol-Soon Kim, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 981 days.

(21) Appl. No.: 11/648,807

(22) Filed: Jan. 3, 2007

(65) Prior Publication Data

US 2007/0171707 A1 Jul. 26, 2007

(30) Foreign Application Priority Data

Jan. 4, 2006 (KR) ............. 10-2006-0001122

(51) Int. Cl.
 *G11C 11/00* (2006.01)
(52) U.S. Cl. ............. 257/40; 200/101; 257/E51.003; 257/E51.023; 257/E51.04; 365/151; 977/709; 977/724; 977/752; 977/943
(58) Field of Classification Search ............ 200/181; 257/40, E51.003, E51.023, E51.04; 365/151, 365/164, 166; 977/708, 709, 724, 725, 731, 977/734, 742, 743, 745, 752, 932, 943
See application file for complete search history.

(56) References Cited

U.S. PATENT DOCUMENTS

| 6,473,351 | B2 * | 10/2002 | Tomanek et al. | 365/215 |
| 7,352,607 | B2 * | 4/2008 | Furukawa et al. | 365/151 |
| 7,382,648 | B2 * | 6/2008 | Bockrath | 365/164 |
| 7,456,482 | B2 * | 11/2008 | Busta et al. | 257/415 |
| 7,564,085 | B2 * | 7/2009 | Jang et al. | 257/296 |
| 7,668,004 | B2 * | 2/2010 | Furukawa et al. | 365/151 |
| 7,719,111 | B2 * | 5/2010 | Jang et al. | 257/741 |
| 2007/0188268 | A1 * | 8/2007 | Naito et al. | 333/186 |
| 2009/0045391 | A1 * | 2/2009 | Won | 257/9 |

* cited by examiner

*Primary Examiner*—Anh Phung
*Assistant Examiner*—Michael Lulis
(74) *Attorney, Agent, or Firm*—Harness, Dickey & Pierce, P.L.C.

(57) ABSTRACT

A nonvolatile carbon nanotube memory device using multiwall carbon nanotubes and methods of operating and fabricating the same are provided. The nonvolatile memory device may include a substrate, at least one first electrode on the substrate, first and second vertical walls on the at least one first electrode spaced from each other, a multiwall carbon nanotube on the at least one first electrode between the first and second vertical walls, second and third electrodes on the first and second vertical walls respectively and at least one fourth electrode spaced a variable distance D (where $D \geq 0$) from the multiwall carbon nanotubes.

22 Claims, 7 Drawing Sheets

NONVOLATILE CARBON NANOTUBE MEMORY DEVICE USING MULTIWALL CARBON NANOTUBES AND METHODS OF OPERATING AND FABRICATING THE SAME

PRIORITY STATEMENT

This application claims priority under 35 USC §119 to Korean Patent Application No. 10-2006-0001122, filed on Jan. 4, 2006, in the Korean Intellectual Property Office (KIPO), the entire contents of which are incorporated herein by reference.

BACKGROUND

1. Field

Example embodiments relate to a semiconductor memory device and methods of operating and fabricating the same. Other example embodiments relate to a nonvolatile carbon nanotube memory device using multiwall carbon nanotubes and methods of operating and fabricating the same.

2. Description of the Related Art

The data recorded in a nonvolatile memory device may not be lost even though power supply is cut. However, because the nonvolatile memory device is characterized with a lower integration density and a lower operating speed than a volatile memory device (e.g., a DRAM), the application may be limited. Recently, while there has been proposed a nonvolatile memory device having the advantages of a typical nonvolatile memory device and the advantages of a typical volatile memory device, the application of the nonvolatile memory device has been increased.

Examples of the nonvolatile memory device, which have been recently proposed, and have the two advantages, may be FRAM, MRAM, PRAM and/or RRAM. Because the nonvolatile memory device is composed of one transistor and one storage node (e.g., a DRAM), the integration density and operating speed may not be different from the DRAM. However, with the development of information technology, the rapid spread of the internet, and the supply of various contents, the demand for memory devices having a higher memory capacity is increasing.

Therefore, a nonvolatile memory device that is an improvement on the conventional nonvolatile memory device, for example, FRAM, MRAM, PRAM and/or RRAM, in the integration density and electrical characteristics may be developed. Conventional memory devices, which have been developed up to present, may use a carbon nanotube as a storage node in order to increase the integration density.

In the conventional memory device, single-walled carbon nanotubes may be arranged in crossbar arrays. Whether the conventional memory device is in an ON state or OFF state may depend on whether two carbon nanotubes may be in contact with each other at the crosspoint of the two carbon nanotubes. The conventional memory device may be further improved in the integration density and operating speed than the typical memory devices, but the fabrication processes may be complicated. The conventional memory device may periodically prepare a separate support to support the carbon nanotube. Because the carbon nanotubes in the conventional memory device are formed of a long line shape, the carbon nanotube may be placed under periodic deformation and stress.

SUMMARY

Example embodiments provide a nonvolatile carbon nanotube memory device having a simpler structure and being relatively free from deformation or stress, and capable of achieving a higher operating speed and a higher integration density.

Example embodiments also provide methods of operating and fabricating the nonvolatile carbon nanotube memory device.

According to example embodiments, a nonvolatile memory device may include a substrate, at least one first electrode on the substrate, first and second vertical walls on the at least one first electrode spaced from each other; a multiwall carbon nanotube on the at least one first electrode between the first and second vertical walls, second and third electrodes on the first and second vertical walls, respectively and at least one fourth electrode spaced a variable distance D (where $D \geqq 0$) from the multiwall carbon nanotubes.

The first and second vertical walls may include caps having inclined surfaces on upper surfaces of the first and second vertical walls, and the second and third electrodes may be formed on the inclined surfaces of the caps to face each other. The memory device may further include an upper substrate provided above the multiwall carbon nanotube, wherein the at least one fourth electrode may be formed on the upper substrate.

The multiwall carbon nanotube may include a first carbon nanotube within a second carbon nanotube, wherein the first carbon nanotube extends beyond the upper surface of the second carbon nanotube. The at least one first electrode may be buried in the substrate except for an upper surface. The at least one first electrode may include a plurality of first electrodes parallel to the substrate, and the plurality of first electrodes may be spaced a distance.

The at least one fourth electrode may include a plurality of the fourth electrodes parallel to each other, and the plurality of fourth electrodes may be spaced a distance and disposed in a direction crossing the plurality of first electrodes. The memory device may further include at least one third vertical wall having the same shape as the first and second vertical walls, wherein the vertical walls extend to cross the plurality of first electrodes parallel to one of the plurality of fourth electrodes, and the second and third electrodes are on the vertical walls.

The multiwall carbon nanotube may be separately formed on one of the plurality of first electrodes between the vertical walls to form an array of multiwall carbon nanotubes on the substrate. The second electrode disposed on the vertical wall may be connected to the third electrode disposed on the next vertical wall facing the second electrode with one multiwall carbon nanotube interposed therebetween, by an interconnection. The at least one fourth electrode may be buried in the upper substrate except for a surface opposite to the multiwall carbon nanotube.

According to example embodiments, an upper end of the first vertical wall has an inclined surface toward the multiwall carbon nanotube, and an upper end of the second vertical wall has an inclined surface toward the multiwall carbon nanotube, and the second electrode may be disposed on the inclined surface of the first vertical wall, and the third electrode may be disposed on the inclined surface of the second vertical wall. According to example embodiments, the vertical wall may include a cap on an upper surface, the cap may include two inclined surfaces toward different multiwall carbon nanotubes, and the second electrode may be disposed on one inclined surface, and the third electrode may be disposed on another inclined surface of the two inclined surfaces.

According to example embodiments, a method of operating a nonvolatile memory device may include a substrate, at least one first electrode on the substrate, first and second vertical walls on the at least one first electrode spaced from each other, a multiwall carbon nanotube on the at least one first electrode between the first and second vertical walls, second and third electrodes on the first and second vertical walls, respectively and at least one fourth electrode spaced a variable distance D (where D≧0) from the multiwall carbon nanotubes, and applying a voltage between the at least one first electrode and the second and third electrodes or the at least one first electrode and the at least one fourth electrode.

In the operating method, the voltage may be a write voltage applied between the at least one first electrode and the at least one fourth electrode, with different polarities. The voltage may be an erase voltage applied between the at least one first electrode and the second and third electrodes, with different polarities. The at least one first electrode may include a plurality of first electrodes parallel to the substrate to be spaced a distance, the voltage may be applied to one of the plurality of first electrodes. The at least one fourth electrode may include a plurality of fourth electrodes parallel to the upper substrate to be spaced a distance, the voltage may be applied to one of the plurality of fourth electrodes.

According to example embodiments, a method of fabricating a nonvolatile memory device may include providing a substrate, forming at least one first electrode on the substrate, forming first and second vertical walls on the at least one first electrode spaced apart from each other, forming a multiwall carbon nanotube on the at least one first electrode between the first and second vertical walls, forming second and third electrodes on the first and second vertical walls, respectively and forming at least one fourth electrode spaced a variable distance D (where D≧0) from the multiwall carbon nanotubes.

BRIEF DESCRIPTION OF THE DRAWINGS

Example embodiments will be more clearly understood from the following detailed description taken in conjunction with the accompanying drawings.

FIG. 1 is a diagram illustrating an initial state of a nonvolatile carbon nanotube memory device using a multiwall carbon nanotube according to example embodiments;

FIG. 2 is a diagram illustrating a state where a core of a multiwall carbon nanotube (first carbon nanotube) is protruded and contacts with an upper electrode in a nonvolatile carbon nanotube memory device using a multiwall carbon nanotube of FIG. 1;

FIG. 3 is a diagram illustrating the memory device of FIG. 1;

FIGS. 4 and 5 are diagrams illustrating operating methods of the nonvolatile carbon nanotube memory device of FIG. 1;

FIG. 6 is a diagram illustrating a memory array, in which the memory device of FIG. 1 is used as a unit cell; and FIG. 7 is a diagram illustrating a method of applying a voltage to the memory array of FIG. 6.

DETAILED DESCRIPTION OF EXAMPLE EMBODIMENTS

Figure 1:
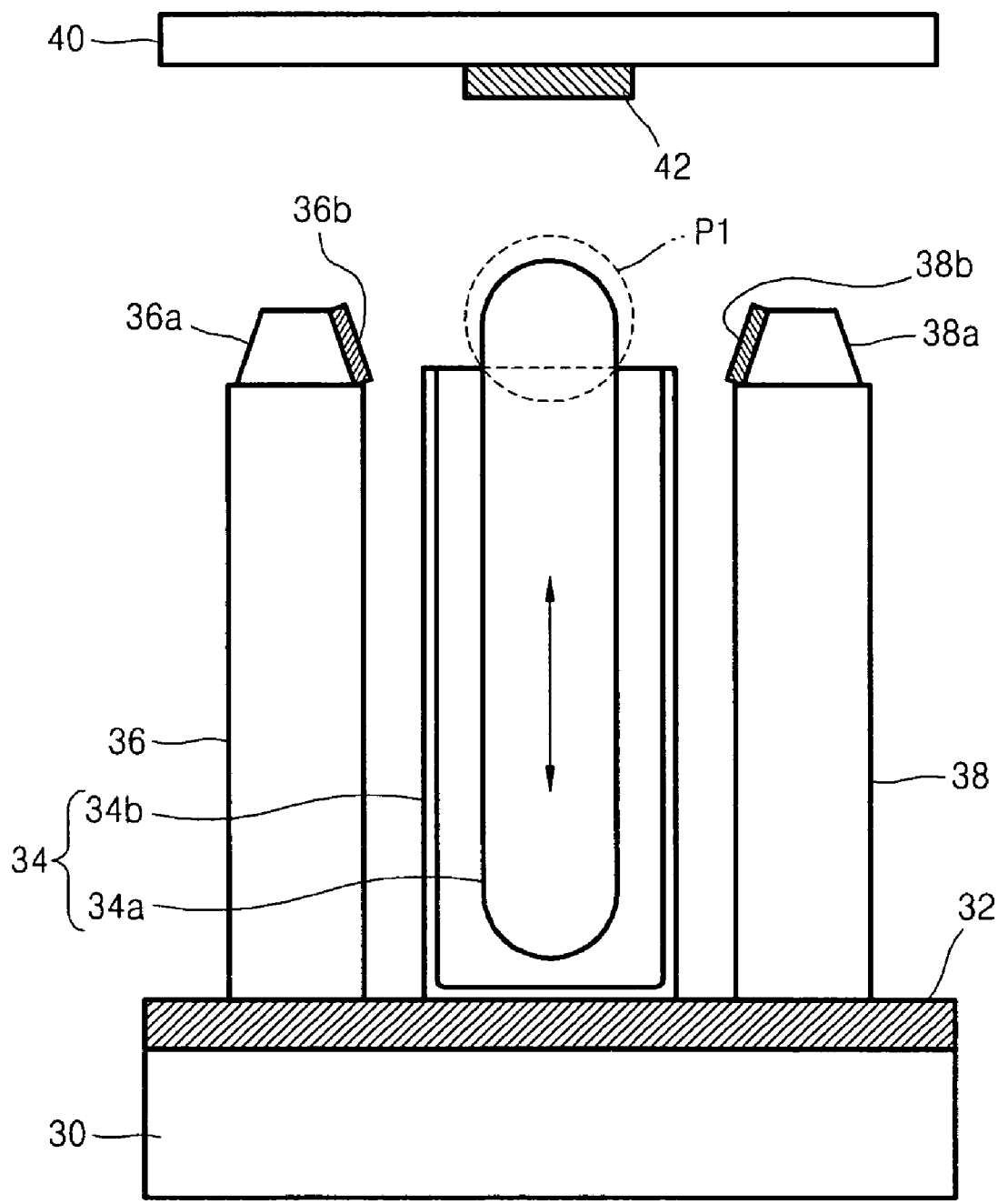
FIGS. 1-7 represent non-limiting, example embodiments as described herein.

Hereinafter, a nonvolatile carbon nanotube memory device according to example embodiments (hereinafter, referred to as "memory device") will be described more fully hereinafter with reference to the accompanying drawings, in which example embodiments are shown. In the drawings, the thicknesses of layers and regions are exaggerated for clarity. Like reference numbers refer to like elements throughout the specification.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring to FIG. 1, a first electrode 32 may be formed on a substrate 30. The substrate 30 may be a silicon substrate. The first electrode 32 may be formed with a film shape. The first electrode 32 may be used as a lower electrode. First and second vertical walls 36 and 38 may be formed on the first electrode 32, and each wall may have a predetermined or given thickness. The first and second vertical walls 36 and 38 may be composed of a same material. The first and second vertical walls 36 and 38 may be spaced apart at a predetermined or given distance. A first cap 36a may be disposed on top of the first vertical wall 36, and a second cap 38a may be disposed on top of the second vertical wall 38. The first and second caps 36a and 38a may be composed of the same material as that of the first and second vertical walls 36 and 38. The opposite surfaces of the first and second caps 36a and 38a may be inclined surfaces. A second electrode 36b may be disposed on the inclined surface of the first cap 36a, and a third electrode 38b may be disposed on the inclined surface of the second cap 38a.

A multiwall carbon nanotube 34 may be disposed on the first electrode 32 between the first and second vertical walls 36 and 38. The multiwall carbon nanotube 34 may be spaced from the first and second vertical walls 36 and 38. The multiwall carbon nanotube 34 may be, for example, a double-walled carbon nanotube. The double-walled carbon nanotube may include a first carbon nanotube 34a forming an inner shell, and a second carbon nanotube 34b forming an outer shell. An upper end of the second carbon nanotube 34b may be lower than an upper end of the first carbon nanotube 34a. The second carbon nanotube 34b may be provided such that an upper portion is lower by a predetermined or given height than the height of the first carbon nanotube 34a. An upper portion P1 of the first carbon nanotube 34a may be exposed with a predetermined or given length out of the second carbon nanotube 34b.

A height of the multiwall carbon nanotube 34 may be equal to or greater than the heights of the first and second vertical walls 36 and 38. The height of the multiwall carbon nanotube 34 may be lower than the heights of the first and second vertical walls 36 and 38. An upper substrate 40 may be disposed over the multiwall carbon nanotube 34. The upper substrate 40 may be spaced from the multiwall carbon nanotube 34, for example, several nanometers. A fourth electrode 42 may be formed on a bottom surface of the upper substrate 40, for example, a surface opposite to the first carbon nanotube 34a. The fourth electrode 42 may be formed along the bottom surface of the upper substrate 40 to cross the first electrode 32. The fourth electrode 42 may be used as an upper electrode.

If the voltage applied to the memory device satisfies given conditions, the first carbon nanotube 34a may slide into or out of the second carbon nanotube 34b in the multiwall carbon nanotube 34. A resistance force interfering with the sliding of the first carbon nanotube 34a may exist between the first and second carbon nanotubes 34a and 34b, but because the resistance force is relatively or insignificantly small, it may be ignored.

Figure 2:
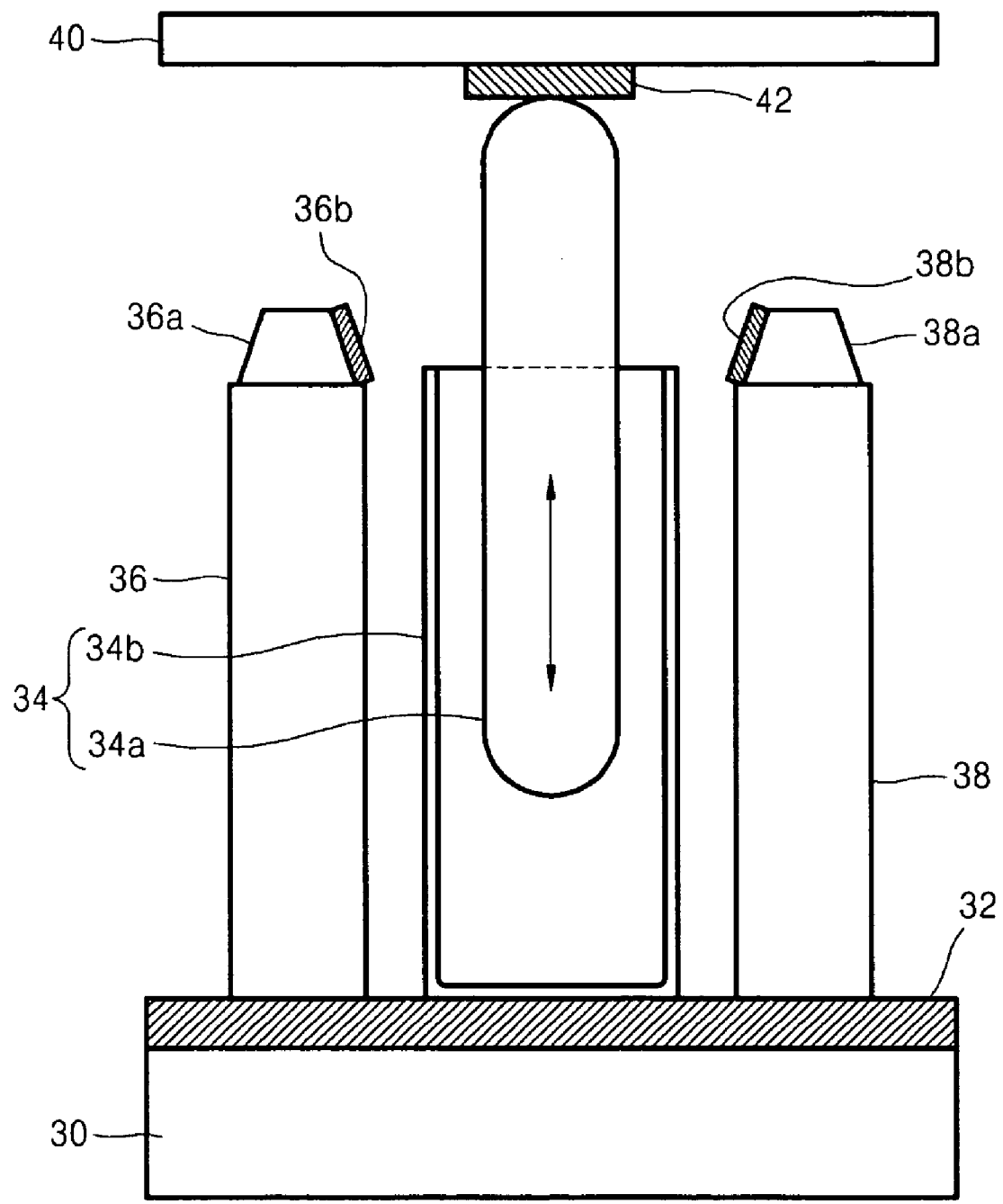

FIG. 2 illustrates when the first carbon nanotube 34a is protruded, and an upper end contacts with the upper electrode 42. In the operation of the memory device to be explained later, when the first carbon nanotube 34a is protruded and contacts with the upper electrode 42 as illustrated in FIG. 2, it may be considered that the memory device is in an ON state. When the memory device is in an ON state, it may be presumed that data '1' is recorded in the memory device. On the contrary, when the first carbon nanotube 34a is not protruded from the second carbon nanotube 34b, the first carbon nanotube 34a may not be in contact with the upper electrode 42. The memory device may be considered in an OFF state. When the memory device is in an OFF state, it may be presumed that data '0' is recorded in the memory device.

Figure 3:
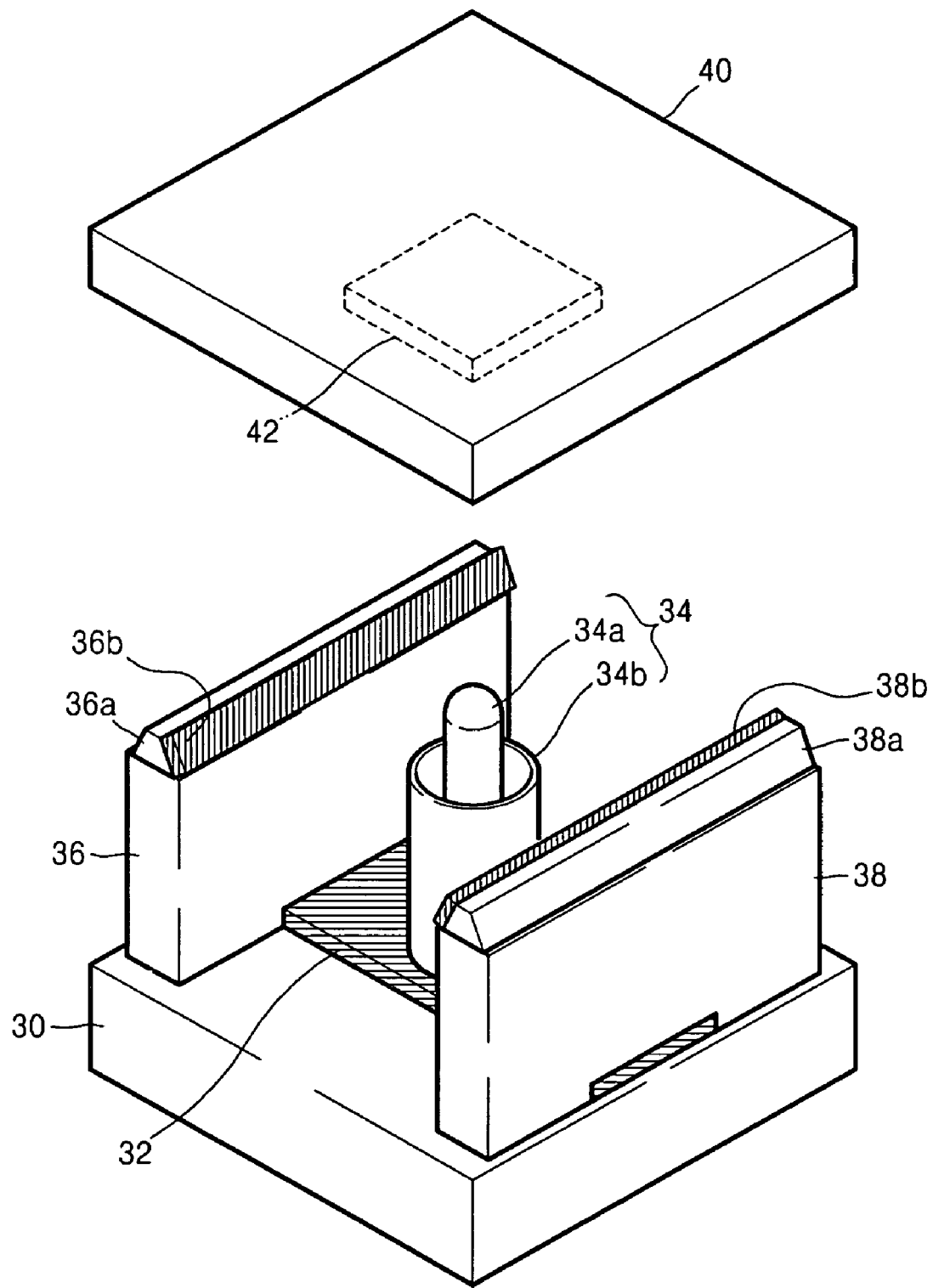

FIG. 3 illustrates the whole exterior shape of the memory device. In FIG. 3, the first electrode 32 may be formed buried in the substrate 30, except for an upper surface. The fourth electrode 42 may be also formed to be buried in the upper substrate 40, except for a bottom surface. An operating method of the memory device structured as above will be explained.

Figure 4:
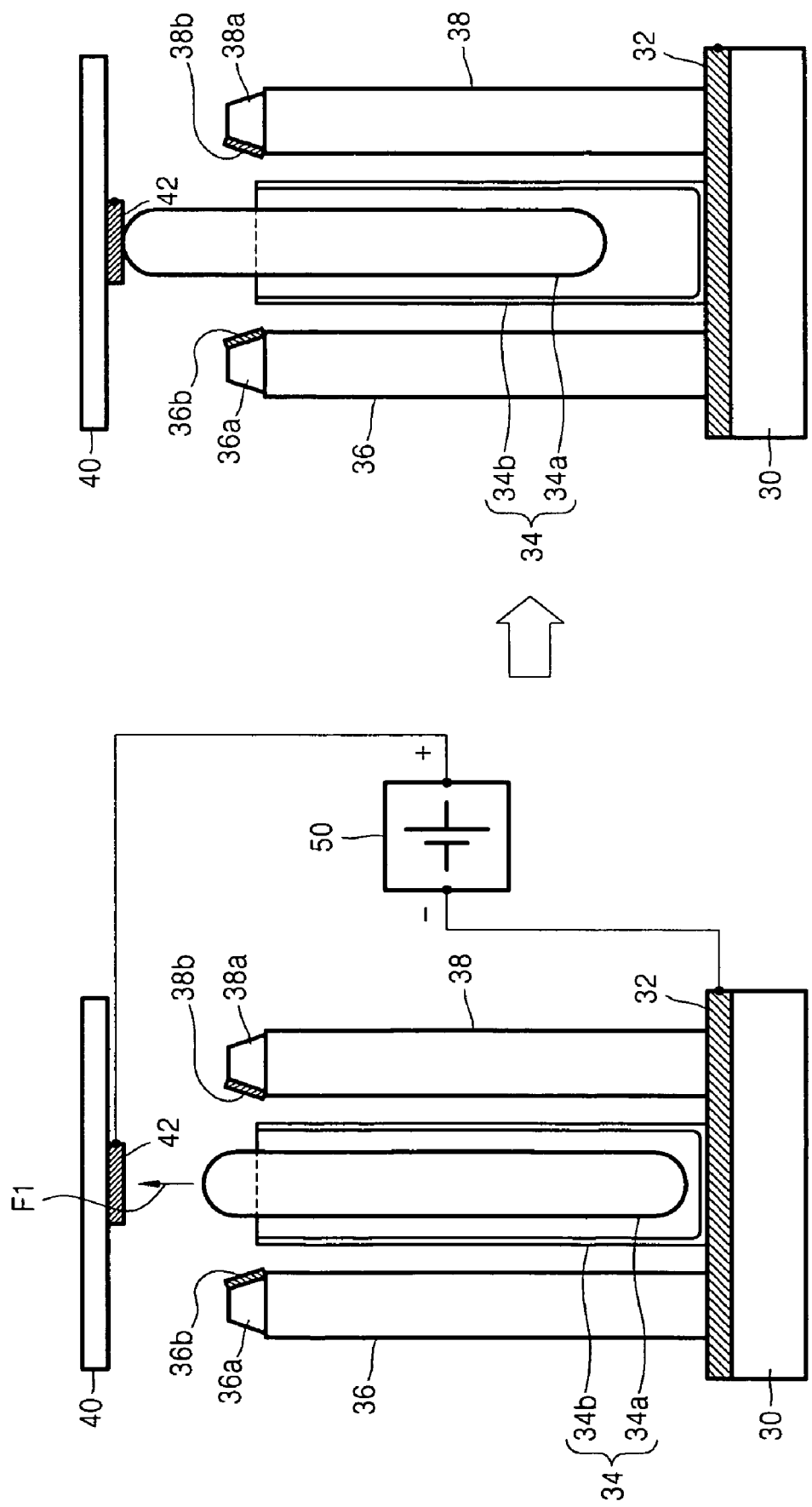

Referring to FIG. 4, a power source 50 may be connected between the first electrode 32 as a lower electrode, and the fourth electrode 42 as an upper electrode, to apply a negative voltage to the first electrode 32. A positive voltage may be applied to the fourth electrode 42. Because the multiwall carbon nanotube 34 is formed on the first electrode 32, a negative voltage may be applied to the first carbon nanotube 34a. When a potential difference between the first and fourth electrodes 32 and 42 is at a predetermined or given value or higher, and if a first electrostatic force F1 applied between the fourth electrode 42 and the first carbon nanotube 34a is higher than a first van der Waals force as an attractive force between a lower end of the first carbon nanotube 34a and a lower end of the second carbon nanotube 34b, the first carbon nanotube 34a may protrude from the second carbon nanotube 34b and contact with the fourth electrode 42 as illustrated in the right portion of FIG. 4. The memory device may be in an ON state. It may be presumed that data '1' is recorded in the memory device. The process illustrated in FIG. 4 may be shown as a process of recording data '1' in the memory device.

As a write voltage is applied between the first electrode 32 and the fourth electrode 42 as described above, and after the first carbon nanotube 34a contacts with the fourth electrode 42, a second van der Waals force attracting each other may be applied between the first carbon nanotube 34a and the fourth electrode 42. After the write voltage is applied, and even though the voltage applied to the first and fourth electrodes 32 and 42 is removed, the contact state of the first carbon nanotube 34a and the fourth electrode 42 may be maintained by the second van der Waals force. The data '1' recorded in the memory device as the write voltage may be applied and is not lost after the voltage is removed. The memory device means a nonvolatile memory device.

Figure 5:
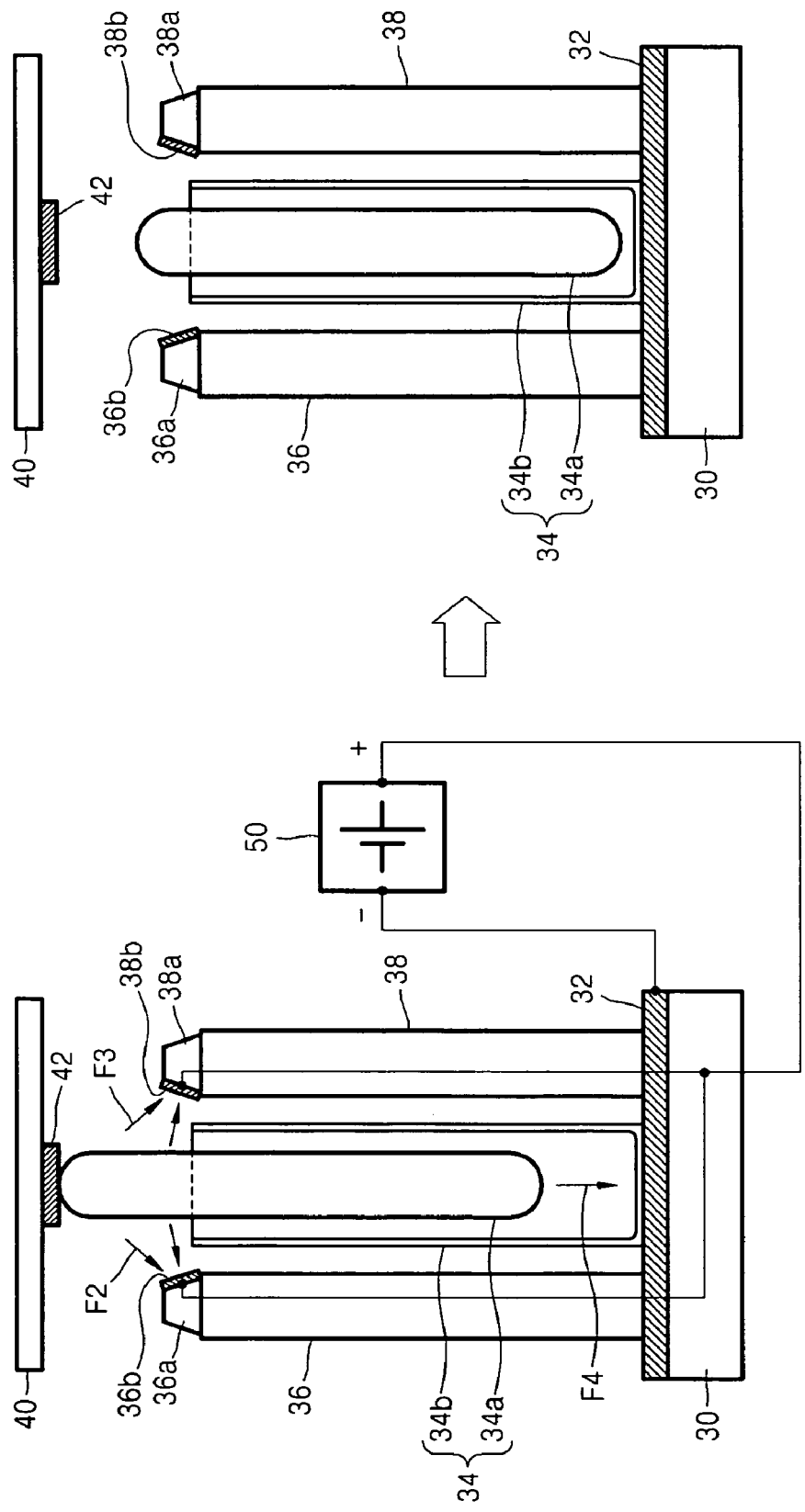

Referring to FIG. 5, when the first carbon nanotube 34a is in contact with the fourth electrode 42 in the memory device, a predetermined or given voltage may be applied between the first electrode 32, and the second and third electrodes 36b and 38b. A negative voltage may be applied to the first electrode 32, and positive voltages may be applied to the second and third electrodes 36b and 38b, but voltages may be applied vice versa. As a result of the applied voltage, a second electrostatic force F2 attracting each other may be exerted between the second electrode 36b and the upper end of the first carbon nanotube 34a. A third electrostatic force F3 attracting each other may be exerted between the third electrode 38b and the upper end of the first carbon nanotube 34a. Even though relatively weak, a resistive force F4 may be applied between the lower end of the first carbon nanotube 34a and the lower end of the second carbon nanotube 34b, to resist the protrusion of the first carbon nanotube 34a and attract the first carbon nanotube 34a.

When the predetermined or given voltage applied between the first electrode 32, and the second and third electrodes 36b and 38b is increased, and the sum of the second and third electrostatic forces F2 and F3 and the resistive force F4 is greater than the second van der Waals force exerted between the fourth electrode 42 and the upper end of the first carbon nanotube 34a, the first carbon nanotube 34a may be separated from the fourth electrode 42 and come into the second carbon nanotube 34b as illustrated in the right portion of FIG. 5, which forms the initial state. The first carbon nanotube 34a may come back to the state before the write voltage is applied to the memory device. Because the first van der Waals force is exerted between the lower end of the first carbon nanotube 34a and the lower end of the second carbon nanotube 34b in this state, the first carbon nanotube 34a may be maintained spaced apart from the fourth electrode 42 as illustrated in the right portion of FIG. 5 unless the write voltage is again applied. Because it is presumed that data '0' is recorded in this state, the data '0' recorded in the memory device may not be volatilized even though the applied voltage is removed like the case of data '1'.

From the above result, the data '1' recorded in the memory device may be removed in the process of applying the voltage as illustrated in FIG. 5. The process of applying the voltage as illustrated in FIG. 5 may be a process of applying an erase voltage to remove data. When the write voltage is applied, and the fourth electrode 42 and the first carbon nanotube 34a contact each other as illustrated in FIG. 4 (hereinafter, a first state), a resistance in a current flowing through the first electrode 32, the multiwall carbon nanotube 34, and the fourth electrode 42 may be relatively low. On the contrary, when the erase voltage is applied, and the fourth electrode 42 and the first carbon nanotube 34a are maintained in a non-contact state as illustrated in FIG. 5 (hereinafter, a second state), a resistance in a current flowing through the first electrode 32, the multiwall carbon nanotube 34, and the fourth electrode 42 may be higher than that of the first state.

The memory device may have two different resistances according to whether the fourth electrode 42 contacts the first carbon nanotube 34a or not. A predetermined or given read voltage may be applied between the first electrode 32 and the fourth electrode 42 to measure a resistance. By comparing the measured resistance with a reference resistance, the data recorded in the memory device may be read. The read voltage may be lower than the write voltage.

For example, when the resistance of the memory device measured by applying a predetermined or given read voltage between the first and fourth electrodes 32 and 42 is lower than the reference resistance, and the first carbon nanotube 34a and the fourth electrode 42 contact with each other in the memory device, it may be acknowledged that data '1' is recorded in the memory device. On the contrary, when the resistance of the memory device measured by applying a predetermined or given read voltage between the first and fourth electrodes 32 and 42 is higher than the reference resistance, and the first carbon nanotube 34a and the fourth electrode 42 are not in contact with each other in the memory device, it may be acknowledged that data '0' is read from the memory device.

Figure 6:
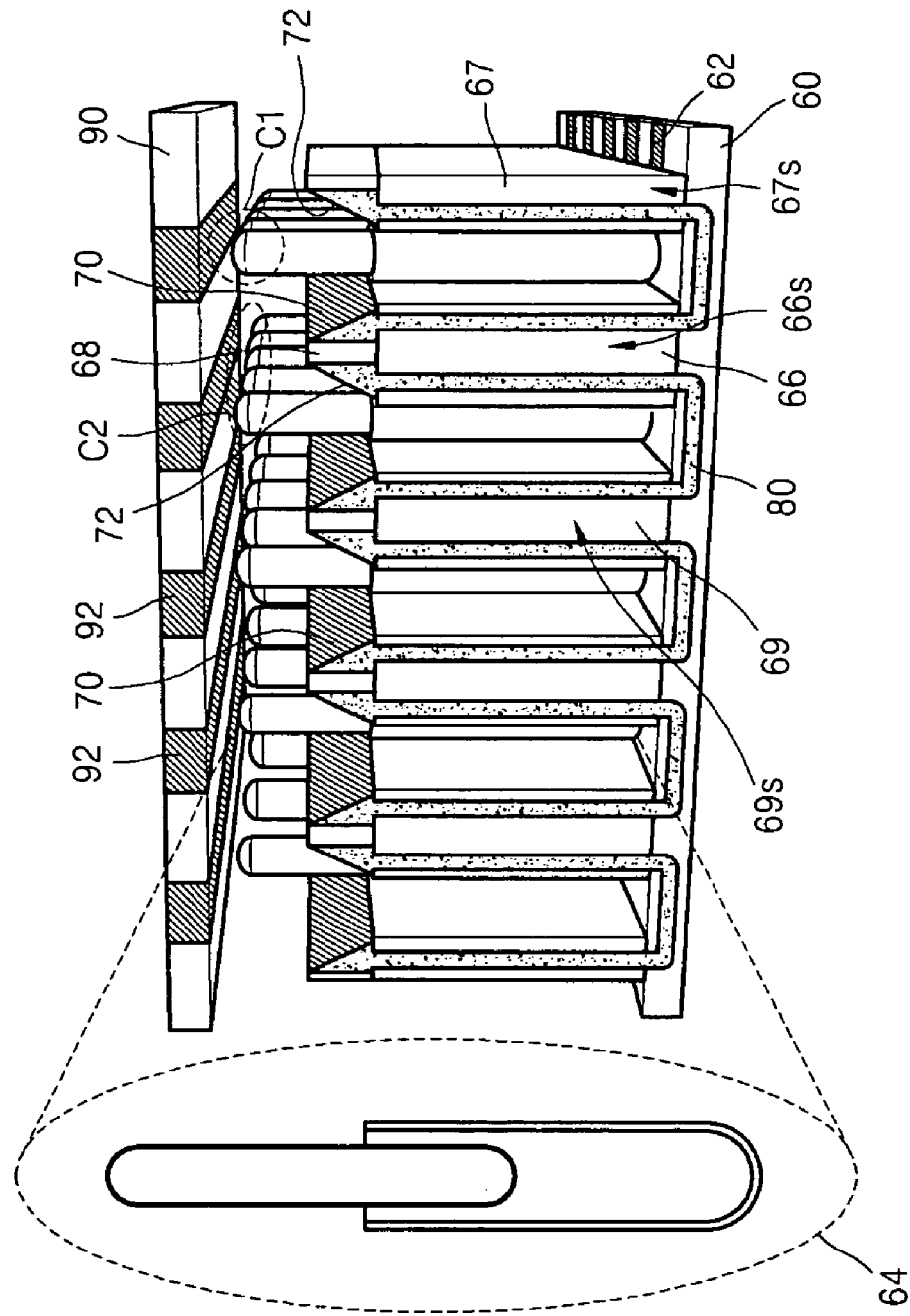

FIG. 6 illustrates an example of the memory array composed of a plurality of memory devices aligned by column and row. In the memory array illustrated in FIG. 6, the column may be defined as a direction parallel to the electrode 62, and the row may be defined as a direction perpendicular to the electrode 62. Referring to FIG. 6, a plurality of electrodes 62 may be formed on a substrate 60 with a predetermined or given distance from one another. The substrate 60 may be formed of the same material as that of the substrate 30 of the memory device as described above. Each of the plurality of the electrodes 62 may be provided with the same shape as that of the first electrode 32 as illustrated in FIG. 3, and may be composed of the same material as that of the first electrode 32. A plurality of multiwall carbon nanotubes 64 may be formed on the plurality of the electrodes 62. Each of the multiwall carbon nanotubes 64 may be the same as the multiwall carbon nanotube 34 as illustrated in FIGS. 1-3.

A plurality of the multiwall carbon nanotubes 64 may be disposed on each electrode 62 to be spaced from one another by a predetermined or given distance. Because the electrodes 62 are disposed with a uniform distance, the multiwall carbon nanotubes 64 may be disposed with a uniform distance in the direction perpendicular to the electrode 62. The plurality of the multiwall carbon nanotubes 64 may form a matrix on the substrate 60. A vertical wall 66 may be disposed between the plurality of the multiwall carbon nanotubes 64, along the direction perpendicular to the electrode 62. The vertical wall 66 may be the same wall as either one of the first and second vertical walls 36 and 38 of FIGS. 1-3. Fifth and sixth electrodes 70 and 72 may be provided on a top surface of the vertical wall 66 and separated from each other by a separation wall 68. The fifth and sixth electrodes 70 and 72 may be provided on each of the plurality of vertical walls 66. The fifth electrode 70 may be disposed opposite to one row C1 of two neighboring multiwall carbon nanotube rows C1 and C2 on the vertical wall 66. The sixth electrode 72 may be disposed opposite to the other row C2. The fifth electrode 70 of the vertical wall 66 may be disposed opposite to the sixth electrode 72 disposed on top of the neighboring vertical wall 67, with the multiwall carbon nanotubes 64 disposed therebetween. The sixth electrode 72 of the vertical wall 66 may be disposed opposite to the fifth electrode 70 disposed on top of the neighboring vertical wall 69, with the multiwall carbon nanotubes 64 disposed therebetween.

A plurality of interconnections 80 may be disposed in the memory array as illustrated in FIG. 6. Each of the interconnections 80 may connect the fifth electrode 70 of the vertical wall 66, and the sixth electrode 72 of the neighboring vertical wall 67. The interconnection 80 may be formed on an outer surface 66s of the vertical wall 66, on an outer surface 67s of the vertical wall 67 adjacent to the vertical wall 66, on an outer surface 69s of the vertical wall 69 adjacent to the vertical wall 66 and a side surface of the substrate 60 therebetween. An upper substrate 90 may be disposed on the plurality of the multiwall carbon nanotubes 64 forming a matrix. The upper substrate 90 may be the same as the upper substrate 40 of FIG. 3. A plurality of upper electrodes 92 may be formed on a bottom surface of the upper substrate 90 over the multiwall carbon nanotubes 64. The plurality of upper electrodes 92 may be disposed with a uniform distance to cross the electrode 62 formed on the substrate 60. The upper electrodes 92 may be disposed corresponding to rows of the plurality of multiwall carbon nanotubes. The upper electrodes 92 may be formed to be buried in the upper substrate 90 except for their bottom surface.

Figure 7:
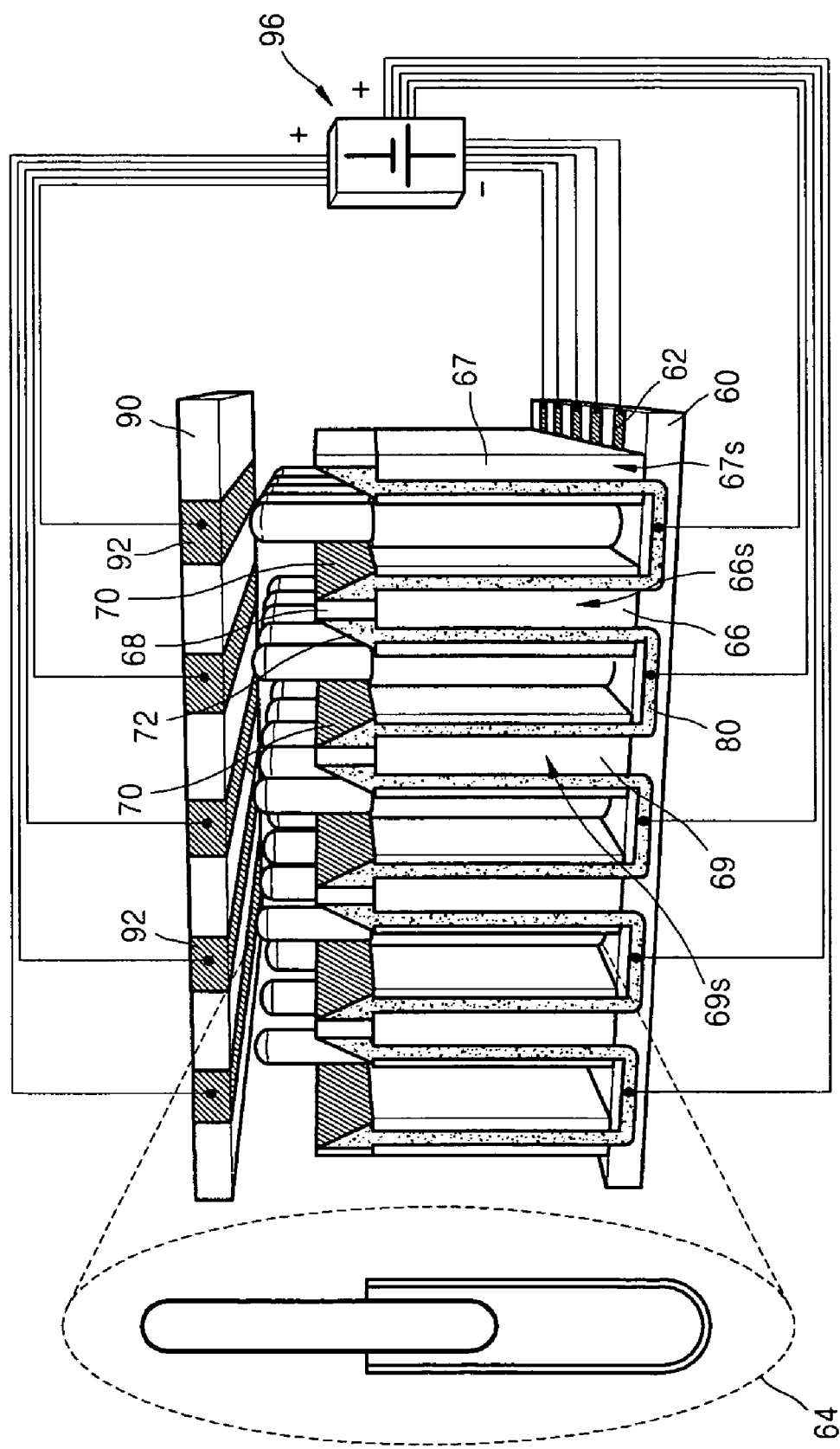

FIG. 7 illustrates a method of applying a voltage for driving the memory array of FIG. 6. Referring to FIG. 7, a positive voltage may be applied to each interconnection 80. A negative voltage may be applied to each electrode 62. A positive voltage may be applied to each upper electrode 92 disposed on the upper substrate 90. These voltages may be applied from a power unit 96 disposed out of the memory array. A voltage control circuit (not shown) may determine to which electrode among the plurality of electrodes 62 a voltage will be applied, to which upper electrode 92 among the plurality of upper electrodes 92 a voltage will be applied, and to which interconnection among the plurality of interconnections 80 a voltage will be applied.

The voltage control circuit may select one electrode 62 and one upper electrode 92 and/or one interconnection 80. Among the plurality of multiwall carbon nanotubes 64, the one multiwall nanotube 64 to which an operational voltage is finally applied may be a multiwall carbon nanotube disposed on the crosspoint where one electrode 62 selected by the voltage control circuit crosses with one upper electrode 92 selected by the voltage control circuit, or a multiwall carbon nanotube disposed on the crosspoint where one interconnection 80 selected by the voltage control circuit crosses with one upper electrode 92 selected by the voltage control circuit. The selection of one interconnection means the selection of one fifth electrode 70 on a vertical wall and one sixth electrode 72 on another vertical wall connected by the selected interconnection.

A voltage applied between one electrode 62 and one upper electrode 92 may be a write voltage for recording data '1' to the multiwall carbon nanotube disposed on the crosspoint where the electrodes 62 and 92 cross with each other. A voltage applied between one interconnection 80 and one electrode 62 may be an erase voltage for erasing data '1' recorded in the multiwall carbon nanotube disposed on the crosspoint where one interconnection 80 and one electrode 62 cross with each other, or may be a voltage for maintaining the initial state of the multiwall carbon nanotube, for example, the state where the multiwall carbon nanotube and the upper electrode 92 are maintained in a non-contact state. A voltage lower than the write voltage may be applied between one electrode 62 and one upper electrode 92, and the voltage may be intended to read the data recorded in the multiwall carbon nanotube disposed on the crosspoint where one electrode 62 and one upper electrode 92 cross with each other.

Example embodiments have been particularly described, but it must be understood that example embodiments have been explained not to limit the scope of example embodiments. For example, it will be understood by those skilled in this art that a same polarity voltage may be applied between the first electrode 32 and the fourth electrode 42 illustrated in the memory device of FIGS. 1-3 in order to remove the contact of the multiwall carbon nanotube 34 and the fourth electrode 42 as an upper electrode, rather than applying a different polarity voltage between the first electrode 32, and the second and third electrodes 36b and 38b. While maintaining the technical spirit of example embodiments, the structure of the memory device of FIGS. 1-3 may be changed and modified. The carbon nanotube may be replaced with a different nanotube. Therefore, the scope must be determined by the technical spirit of example embodiments as defined by the following claims.

As described above, the nonvolatile memory device may be structurally simpler. Each multiwall carbon nanotube may be located on the unit cell, and only the multiwall nanotube may be operable in the unit cell. Therefore, multiwall carbon nanotubes may be relatively free from deformation and stress, and the nonvolatile memory device may have increased integration density. Furthermore, because the memory device may perform a memory function by a relatively minute movement of the core of the multiwall carbon nanotube, an operating voltage may be decreased, and an operating speed may be increased. Resistibility to surrounding circumstances (for example, temperature and/or magnetic field) may be increased.

While example embodiments have been particularly shown and described with reference to exemplary embodiments thereof, it will be understood by those of ordinary skill in the art that various changes in form and details may be made therein without departing from the spirit and scope of the following claims.

What is claimed is:

1. A nonvolatile memory device comprising:
   a substrate;
   at least one first electrode on the substrate;
   first and second vertical walls on the at least one first electrode spaced apart from each other;
   a multiwall carbon nanotube on the at least one first electrode between the first and second vertical walls;
   second and third electrodes on the first and second vertical walls, respectively; and
   at least one fourth electrode spaced a variable distance D (where $D \geqq 0$) from the multiwall carbon nanotubes.

2. The nonvolatile memory device of claim 1, wherein the first and second vertical walls include caps having inclined surfaces on upper surfaces of the first and second vertical walls, and the second and third electrodes are formed on the inclined surfaces of the caps to face each other.

3. The nonvolatile memory device of claim 1, further comprising:
   an upper substrate provided above the multiwall carbon nanotube, wherein the at least one fourth electrode is formed on the upper substrate.

4. The nonvolatile memory device of claim 3, wherein the at least one fourth electrode is buried in the upper substrate except for a surface opposite to the multiwall carbon nanotube.

5. The nonvolatile memory device of claim 1, wherein the multiwall carbon nanotube includes a first carbon nanotube within a second carbon nanotube, wherein the first carbon nanotube extends beyond the upper surface of the second carbon nanotube.

6. The nonvolatile memory device of claim 1, wherein the at least one first electrode is buried in the substrate except for an upper surface.

7. The nonvolatile memory device of claim 1, wherein the at least one first electrode includes a plurality of first electrodes parallel to the substrate, and the plurality of first electrodes are spaced a distance.

8. The nonvolatile memory device of claim 7, wherein the at least one fourth electrode includes a plurality of fourth electrodes parallel to each other, and the plurality of the fourth electrodes are spaced a distance and disposed in a direction crossing the plurality of first electrodes.

9. The nonvolatile memory device of claim 8, further comprising:
   at least one third vertical wall having the same shape as the first and second vertical walls, wherein the vertical walls extend to cross the plurality of first electrodes parallel to one of the plurality of fourth electrodes, and the second and third electrodes are on the vertical walls.

10. The nonvolatile memory device of claim 7, further comprising:
    at least one third vertical wall having the same shape as the first and second vertical walls, wherein the vertical walls extend to cross the plurality of first electrodes and are parallel to the at least one fourth electrode, and the second and third electrodes are both on each vertical wall.

11. The nonvolatile memory device of claim 10, wherein the multiwall carbon nanotube is separately formed on one of the plurality of first electrodes between the vertical walls to form an array of multiwall carbon nanotubes on the substrate.

12. The nonvolatile memory device of claim 10, wherein the second electrode disposed on the vertical wall is connected to the third electrode disposed on the next vertical wall facing the second electrode with one multiwall carbon nanotube interposed therebetween, by an interconnection.

13. The nonvolatile memory device of claim 10, wherein the vertical wall includes a cap on an upper surface, the cap includes two inclined surfaces toward different multiwall carbon nanotubes, respectively, and the second electrode is disposed on one inclined surface, and the third electrode is disposed on another inclined surface of the two inclined surfaces.

14. The nonvolatile memory device of claim 1, wherein an upper end of the first vertical wall has an inclined surface toward the multiwall carbon nanotube, and an upper end of the second vertical wall has an inclined surface toward the multiwall carbon nanotube, and the second electrode is disposed on the inclined surface of the first vertical wall, and the third electrode is disposed on the inclined surface of the second vertical wall.

15. A method of operating a nonvolatile memory device comprising:
providing at least one first electrode, first and second vertical walls on the at least one first electrode with spaced from each other, a multiwall carbon nanotube formed on the at least one first electrode between the first and second vertical walls, second and third electrodes on the first and second vertical walls, respectively and at least one fourth electrode spaced a variable distance D (where D>0) from the multiwall carbon nanotubes; and
applying a voltage between the at least one first electrode and the second and third electrodes or the at least one first electrode and the at least one fourth electrode.

16. The method of claim 15, wherein the voltage is a write voltage applied between the at least one first electrode and the at least one fourth electrode, with different polarities.

17. The method of claim 15, wherein the voltage is an erase voltage applied between the at least one first electrode and the second and third electrodes, with different polarities.

18. The method of claim 15, wherein the at least one first electrode includes a plurality of first electrodes parallel to the substrate spaced a distance, the voltage applied to one of the plurality of first electrodes.

19. The method of claim 18, wherein the at least one fourth electrode includes a plurality of fourth electrodes parallel to the upper substrate to be spaced a distance, the voltage applied to one of the plurality of fourth electrodes.

20. The method of claim 19, wherein the first and second vertical walls includes a plurality of vertical walls formed on the substrate to cross the at least one first electrode and parallel to the at least one fourth electrode, the first and second vertical walls are two neighboring vertical walls selected from the plurality of vertical walls, and the second and third electrodes are on the plurality of vertical walls.

21. The method of claim 20, wherein the second electrode on one selected vertical wall of the plurality of vertical walls is connected to the third electrode disposed on the next vertical wall facing the second electrode with one multiwall carbon nanotube interposed therebetween, by an interconnection, and the voltage is applied to the second and third electrodes through the interconnection.

22. A method of fabricating a nonvolatile memory device comprising:
providing a substrate;
forming at least one first electrode on the substrate;
forming first and second vertical walls on the at least one first electrode spaced apart from each other;
forming a multiwall carbon nanotube on the at least one first electrode between the first and second vertical walls;
forming second and third electrodes on the first and second vertical walls, respectively; and
forming at least one fourth electrode spaced a variable distance D (where $D \geq 0$) from the multiwall carbon nanotubes.

* * * * *